US005744832A

United States Patent [19]
Wolters et al.

[11] Patent Number: 5,744,832
[45] Date of Patent: Apr. 28, 1998

[54] SEMICONDUCTOR DEVICE HAVING A FERROELECTRIC MEMORY ELEMENT WITH A LOWER ELECTRODE PROVIDED WITH AN OXYGEN BARRIER

[75] Inventors: Robertus A.M. Wolters; Johanna H.H.M. Kemperman, both of Eindhoven, Netherlands

[73] Assignee: U.S. Philips Corporation, New York, N.Y.

[21] Appl. No.: 538,515

[22] Filed: Oct. 3, 1995

[30] Foreign Application Priority Data

Nov. 25, 1994 [EP] European Pat. Off. ............ 94202867

[51] Int. Cl.$^6$ .................. H01L 25/76; H01L 29/94; H01L 31/119; H01L 31/62; H01L 31/113
[52] U.S. Cl. ............................. 257/295; 257/296
[58] Field of Search .................... 257/295, 296, 257/310, 769, 773

[56] References Cited

U.S. PATENT DOCUMENTS

| | | | |
|---|---|---|---|
| 5,164,808 | 11/1992 | Evans, Jr. et al. | 257/295 |
| 5,300,799 | 4/1994 | Nakamura et al. | 257/295 |
| 5,313,089 | 5/1994 | Jones, Jr. | 257/295 |
| 5,382,817 | 1/1995 | Kashihara et al. | 257/295 |
| 5,555,486 | 9/1996 | Kingon et al. | 257/295 |

FOREIGN PATENT DOCUMENTS 0478799  4/1992  European Pat. Off. ...... H01L 29/792

OTHER PUBLICATIONS

"VLSI Technology", by S.M. Sze, McGraw-Hill Book Company (Background reference text—copy not provided).

"Silicon Processing for the VLSI Era", by S. Wolf., vol. 1, 2 Lattice Press (Background reference text—copy not provided)

Primary Examiner—Tom Thomas
Assistant Examiner—Adriana Giordana
Attorney, Agent, or Firm—Brian J. Wieghaus

[57] ABSTRACT

A semiconductor device includes a semiconductor body (3) with a semiconductor element (1) with an electrically conducting region (5) on which a capacitor (2) forming a memory element is present with a lower electrode (11), an oxidic ferroelectric dielectric (12), and an upper electrode (13), which lower electrode (11) makes electrical contact with the conducting region (5) and includes a layer with a conductive metal oxide (112) and a layer (111) including platinum. The layer with the conductive metal oxide (112) acts as an oxygen barrier during manufacture. The invention also relates to a method of manufacturing such a semiconductor device. The device is characterized in that the layer including platinum (111) contains more than 15 atom % of a metal capable of forming a conductive metal oxide, and in that the layer (112) with the conductive metal oxide is present between the layer (111) comprising platinum and the ferroelectric dielectric (12). A good electrical contact between the lower electrode (11) and the conducting region (5) after manufacture is achieved thereby.

9 Claims, 2 Drawing Sheets

SEMICONDUCTOR DEVICE HAVING A FERROELECTRIC MEMORY ELEMENT WITH A LOWER ELECTRODE PROVIDED WITH AN OXYGEN BARRIER

BACKGROUND OF THE INVENTION

The invention relates to a semiconductor device comprising a semiconductor body with a semiconductor element comprising an electrically conducting region on which a capacitor forming a memory element is present with a lower electrode, and oxidic ferroelectric dielectric, and an upper electrode, which lower electrode makes electrical contact with the conducting region and comprises a layer with a conductive metal oxide and a layer comprising platinum. The invention also relates to a method of manufacturing such a semiconductor device.

The memory element mentioned above, formed by a capacitor with a ferroelectric material as the dielectric, is a non-volatile memory element. When a voltage is applied across the capacitor and removed again—in other words, a voltage pulse is applied—a remanent polarization will be present in the ferroelectric material. When an equally large voltage pulse of opposite polarity is applied across the capacitor, the remanent polarization is reversed. It is thus possible to switch over repeatedly between two stable polarization states by means of voltage pulses. In practice, the memory element is often connected to a switching transistor which applies the voltage pulses. The aim is, for reasons of economy, to realise as many memory elements per unit surface area as possible on a semiconductor body. This means in practice that the memory elements are often provided on conducting regions such as contact pads, electrodes of switching transistors, and through connections (vias). These conducting regions comprise materials such as doped silicon, silicide, or metal.

A device of the kind mentioned in the opening paragraph is known from European Patent Application EP-A 478799. The lower electrode provided on the conducting region in this device is formed by, in that order, a first layer of a metal which is capable of forming a conductive metal oxide, a layer of the conductive metal oxide, and a platinum layer. On this lower electrode there is lead-zirconium titanate as the oxidic ferroelectric. The layer comprising the conductive metal oxide forms an oxygen barrier which has the object of preventing diffusion of oxygen to the conducting surface during manufacture. This oxygen would oxidize the conducting surface, so that the lower electrode would not make a good electrical contact with the conducting surface.

The known device described has the disadvantage that the electrical contact of the lower electrode with the conducting region is often unsatisfactory in practice in spite of the presence of the oxygen barrier. Thus an increased contact resistance is often measured between the conducting region and the lower electrode.

SUMMARY OF THE INVENTION

The invention has for its object inter alia to counteract the above disadvantage.

According to the invention, the device is for this purpose characterized in that the layer comprising platinum contains more than 15 atom % of a metal capable of forming a conductive metal oxide, and in that the layer comprising the conductive metal oxide is present between the layer comprising the platinum and the ferroelectric dielectric.

It is achieved thereby that the electrical contact between the lower electrode and the conducting region is good after manufacture of the semiconductor device.

The invention is based on the recognition that a non-conducting oxide is still formed at the boundary between the conducting region and the lower electrode through oxidation of the material of the conducting region during manufacture of the known device. A treatment in an atmosphere containing oxygen at a raised temperature is carried out during the manufacture of the known device when the layer with the conductive metal oxide is manufactured and when the ferroelectric dielectric is provided. Oxygen diffuses comparatively easily through the layer comprising platinum during this treatment. A comparatively small quantity of oxygen accordingly also diffuses through the oxygen barrier to the conducting region. A thin, non-conducting oxide layer is then formed on the contacting region. This non-conducting oxide layer in the known semiconductor device leads to a comparatively high contact resistance between the conducting region and the lower electrode. It is surprisingly found that an additional oxygen barrier is formed by the layer comprising platinum and more than 15 atom % of the metal capable of forming the conductive metal oxide during manufacture of the device according to the invention. No or substantially no oxygen can then diffuse to the boundary between the conducting region and the lower electrode during manufacture. The device according to the invention accordingly provides a good electrical contact between the lower electrode and the conducting region. The addition of the metal capable of forming a conductive oxide to the layer comprising platinum does not or substantially not reduce the electrical properties of this layer.

The metal provided as capable of forming a conductive metal oxide may be, for example, rhenium or ruthenium. Preferably, the device according to the invention is characterized in that the metal capable of forming a conductive metal oxide comprises ruthenium. It is achieved thereby that a very good oxygen barrier is formed during manufacture.

An additional advantage is obtained when a layer of the metal capable of forming a conductive oxide is present between the layer comprising platinum and the conducting region. The permeability of the layer comprising platinum to oxygen is very strongly reduced in this embodiment. No increased electrical contact resistance between the conducting region and the lower electrode is measured here, even in the case of long treatments ($\geq 1$ hour) in an atmosphere containing oxygen at elevated temperature (>500° C.). Such a device is comparatively easy to manufacture in that a layer of the metal capable of forming the conductive oxide and a layer of platinum are provided on the conducting region, whereupon these layers are treated at high temperature in an atmosphere containing oxygen. It is suspected that the following process plays a part. The layer of the metal capable of forming a conductive metal oxide forms a diffusion source of metal during the treatment at high temperature. Part of the metal of this layer diffuses into the layer comprising platinum and thus forms an alloy layer of platinum with more than 15 atom % of the metal capable of forming a conductive metal oxide. This alloy layer prevents the diffusion of oxygen to the conducting layer. Another part of the metal capable of forming a conductive metal oxide diffuses through the layer comprising platinum, oxidizes, and thus forms the layer of conductive metal oxide. The oxygen diffusion towards the conducting surface is then prevented both by the alloy layer and by the layer comprising the conductive metal oxide. In the known semiconductor device, such an alloy layer is not formed because the layer of the conductive metal oxide prevents diffusion of the metal capable of forming a conductive metal oxide into the layer comprising platinum.

Preferably, the conducting region comprises tungsten. Tungsten is used very often in electrical lead-throughs (contacts and vias). Since tungsten oxidizes very readily, and the tungsten oxide is volatile at temperatures above approximately 500° C., problems involving tungsten oxidation arise in the manufacture of the known semiconductor device having a conducting region of tungsten. The evaporation of tungsten oxide detaches the lower electrode from the conducting region. In the semiconductor device according to the invention, practically no oxide is formed on tungsten, so that the lower electrode has a good mechanical and electrical contact with the conducting tungsten region.

In the semiconductor device according to the invention, preferably, an electrical connection between or to further parts of the semiconductor device is formed from a layer comprising platinum. A layer comprising platinum is provided on the surface during the manufacture of the lower electrode. The layer comprising platinum of the lower electrode is manufactured from this layer. The layer comprising platinum is then so patterned, according to the invention, that at the same time the lower electrode and one or several further electrical connections are formed in the device. The layer comprising platinum is then also used as an additional wiring layer on the surface of the semiconductor body.

The invention also relates to a method of manufacturing a semiconductor device comprising a semiconductor body with an electrically conducting region on which capacitors forming memory elements are provided, each with a lower electrode, a dielectric, and an upper electrode, whereby a lower electrode comprising platinum with an oxygen barrier layer is provided on the conducting region, an oxidic ferroelectric dielectric is provided, a treatment at elevated temperature in an atmosphere containing oxygen is carried out, and an upper electrode is provided.

Such a method is known from European Patent Application EP-A-478799. In the second embodiment of this known method, a capacitor is provided on a conducting silicon region which forms a source electrode region of a switching transistor. The lower electrode of this capacitor is manufactured through application of a rhenium layer on the source electrode. This rhenium layer is subsequently oxidized during the treatment at elevated temperature in the atmosphere containing oxygen, whereby a top layer of conductive rhenium oxide is created on the rhenium layer. Between the source electrode and the rhenium layer, a rhenium silicide layer arises which is to ensure a good electrical contact between the source electrode and the lower electrode. Then a platinum layer, a ferroelectric dielectric, and an upper electrode are provided on the rhenium oxide layer.

The known method has the disadvantage that silicon oxide is also formed at the boundary between the source electrode and the lower electrode in spite of the formation of the rhenium oxide oxygen barrier. Said silicon oxide causes a comparatively bad electrical contact between source electrode and lower electrode.

The invention has for its object to provide a method which results in a semiconductor device having a good electrical contact between the conducting region and the lower electrode.

According to the invention, the method is characterized in that the lower electrode is provided through codeposition of platinum and a metal capable of forming a conductive oxide, more than 20 atom % of the metal capable of forming a conductive oxide being provided, after which the treatment at elevated temperature in the atmosphere containing oxygen is carried out, and the ferroelectric dielectric is provided.

It is achieved thereby that a layer of conductive metal oxide is formed on the platinum layer and the metal which forms the metal oxide during the treatment at elevated temperature in an oxygen atmosphere. It is found that both this metal oxide layer and the subjacent metal layer formed by codeposition act as oxygen barriers. Owing to this double barrier, practically no oxygen diffuses to the boundary between the conducting region and the lower electrode. A good electrical contact is accordingly created between the conducting surface and the lower electrode. The codeposition also leads to a comparatively smooth surface of the lower electrode. After the treatment at elevated temperature, the atomic percentage of the metal forming a conductive oxide lies above 15% in the layer comprising platinum.

Preferably, ruthenium is provided as the metal capable of forming a conductive oxide. A platinum layer with more than 15% ruthenium and a ruthenium oxide layer together form a very effective barrier against oxygen.

Preferably, a platinum layer is provided on the metal layer created through codeposition after the codeposition of platinum and the metal capable of forming a conductive metal oxide, but before the treatment at elevated temperature. It is found that an oxidic ferroelectric dielectric provided on a lower electrode with such a platinum layer is highly resistant to defects in the dielectric such as arise owing to known fatigue effects.

An additional advantage is obtained when a layer of the metal capable of forming a conductive metal oxide is provided before the codeposition of a layer of platinum and of the metal capable of forming a conductive oxide. It is found in practice in that case that there are no problems involving an increased contact resistance also with very long treatments at elevated temperature in an atmosphere containing oxygen.

BRIEF DESCRIPTION OF THE DRAWINGS

The invention will be explained in more detail below by way of example, with reference to drawings, in which.

The Figures are purely diagrammatic and not drawn to scale. Corresponding parts have been generally given the same reference numerals in the Figures.

DESCRIPTION OF THE PREFERRED EMBODIMENTS

Figure 1:
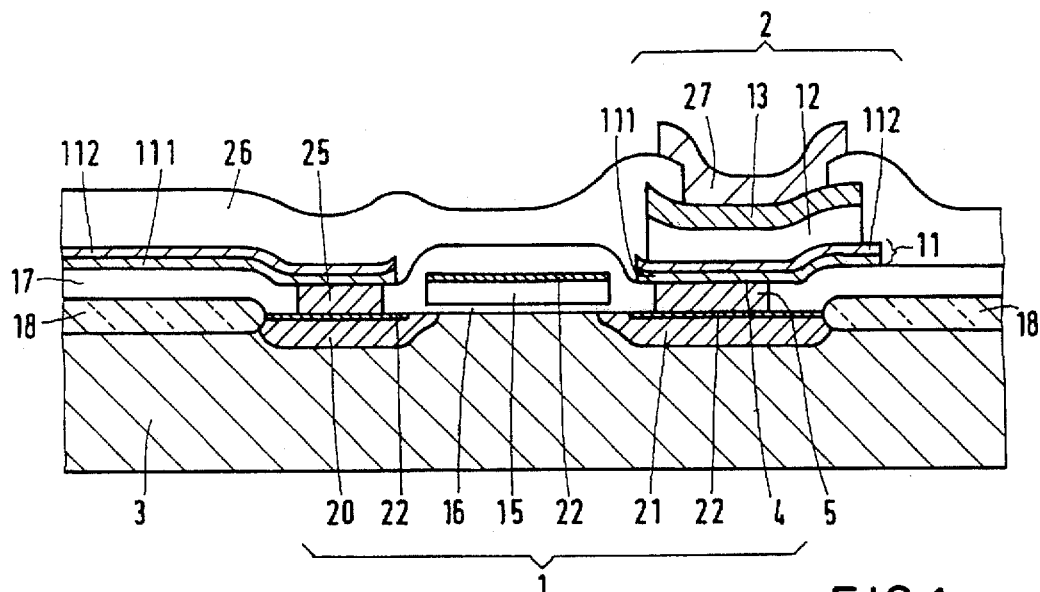
FIG. 1 is a cross-section of a semiconductor device according to the invention.

FIG. 1 is a cross-section of a semiconductor device according to the invention. The semiconductor device comprises a semiconductor body 3 with a semiconductor element 1 in this case a transistor, having an electrically conducting region 5 on which a capacitor 2 forming a memory element is present with a lower electrode 11, an oxidic ferroelectric dielectric 12, and an upper electrode 13, which lower electrode 11 makes electrical contact with the conducting region 5 and comprises a layer 112 with a conductive metal oxide and a layer 111 comprising platinum. The transistor 1 and the capacitor 2 are interconnected by switching electronics. It is possible to switch the ferroelectric dielectric 12 between two stable polarization states by means of these switching electronics. For the sake of clarity, only one transistor 1 and one capacitor 2 have been drawn, but in practice the semiconductor body 3 will comprise very many such transistors and capacitors. The MOS transistor depicted in FIG. 1 is provided in the silicon semiconductor body 3 in a usual manner, with a gate electrode 15 of polycrystalline silicon which is insulated from the semiconductor body 3 by a silicon oxide layer 16 of approximately 30 nm thickness. The gate electrode 15 is further insulated by a layer of silicon oxide 17. Individual transistors are mutually separated by field oxide regions 18. Drain and source regions 20 and 21 of the transistor are made between field oxide 18 and gate electrode 15 by means of diffusion. The MOS transistor of FIG. 1 is manufactured in a known manner.

The aim is, for reasons of economy, to realise as many memory elements per unit surface area as possible on a semiconductor body 3. This means in practice that the memory elements are often provided on conductive regions of semiconductor elements such as contact pads, electrodes of switching transistors, and through connections (vias, plugs). These conductive regions comprise materials such as lead-doped silicon, silicide, or metal. In the example of FIG. 1, the conducting region 5 comprises a tungsten lead-through region (plug). Such tungsten plugs are widely used in practice. Since tungsten oxidizes very readily, there will often be a too high contact resistance between the conducting region and the lower electrode in known semiconductor devices.

According to the invention, the device is characterized in that the layer 111 comprising platinum contains more than 15 atom % of a metal capable of forming a conductive metal oxide, and the layer 112 comprising the conductive metal oxide is present between the layer comprising platinum and the ferroelectric dielectric 12. It is achieved thereby that there is a good electrical contact between the lower electrode 11 and the conducting region 5 after manufacture of the semiconductor device. Ruthenium is preferably chosen as the metal capable of forming a conductive metal oxide.

Figure 2:
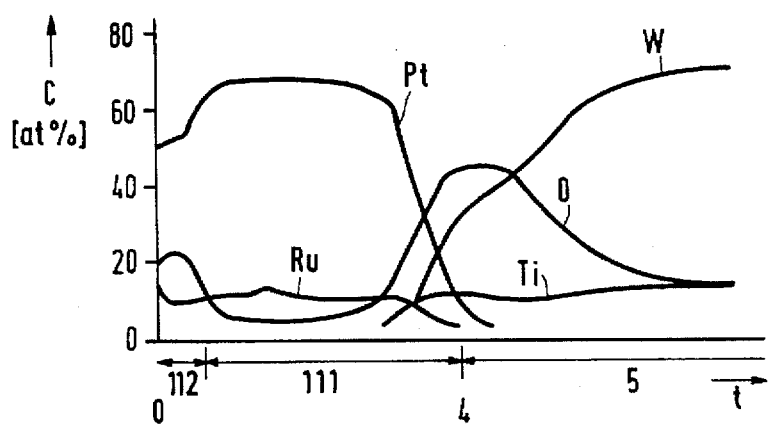
FIGS. 2 and 3 show Auger Electron Spectroscopy (AES) results for various lower electrodes, a sputtering time being plotted horizontally and an atomic concentration being plotted vertically.
Figure 3:
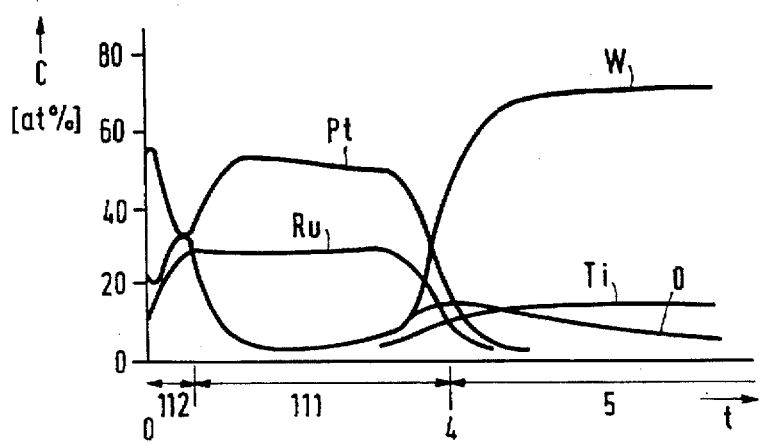

FIGS. 2 and 3 show graphs of data recorded by Auger Electron Spectroscopy (AES). A sputtering time t is plotted horizontally in these Figures. This sputtering time is a measure for the depth below the surface of the lower electrode 11. An atomic concentration in at% is vertically plotted in FIGS. 2, 3. FIG. 2 shows how a tungsten oxide layer is formed at the boundary 4 between the conducting tungsten layer 5 and the layer 11 comprising platinum, given an atomic percentage of approximately 10% ruthenium in platinum after a heat treatment of 1 hour at 550° C. in an $N_2/O_2$ atmosphere. FIG. 3 shows that only a very small quantity of oxygen is present at the boundary 4 for a ruthenium percentage above 15%, in this case approximately 30%, after a heat treatment of 1 hour at 600° C. in an $N_2/O_2$ atmosphere. It is suspected that this oxygen had already been present before the lower electrode 11 was provided. This quantity of oxygen is insufficient for forming a closed tungsten oxide layer on the tungsten of the conducting region 5.

Figure 4:
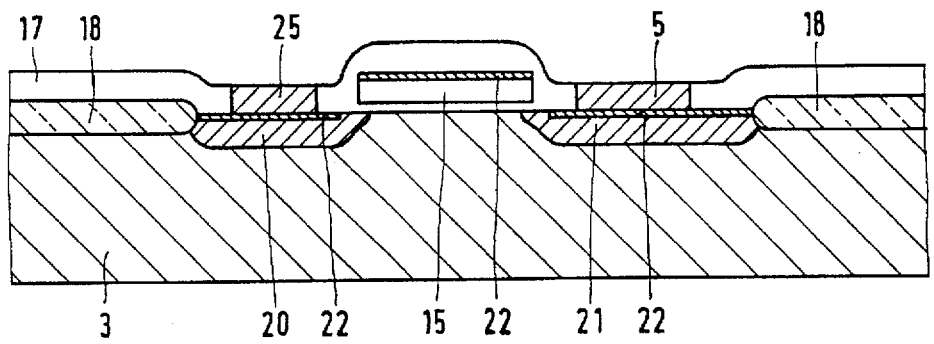
FIGS. 4 and 5 show various stages in the manufacture of a semiconductor device according to the invention.
Figure 5:
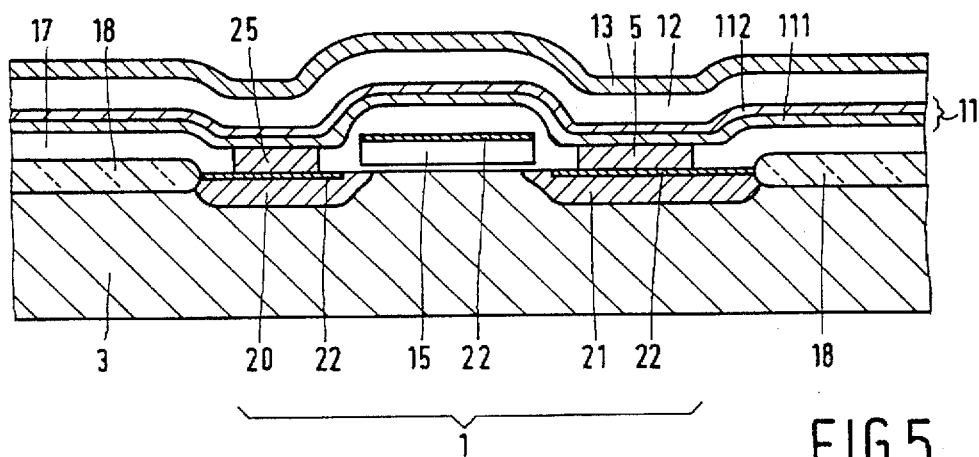

A first embodiment of a semiconductor device is made as follows (see FIGS. 4, 5 and 1). FIG. 4 shows how first a switching transistor 1 with a gate electrode 15, drain region 20, and source region 21 is provided in the semiconductor body 3 in known manner. The gate electrode 15 and the drain and source regions 20 and 21 are provided with silicide layers 22 in known manner. The transistor is screened off with a phosphorus silicate glass layer 17 (PSG) which is manufactured in known manner. This layer 17 is provided with tungsten plugs 25, 5 at the areas of the drain and source regions 20, 21, respectively, in known manner, so as to form the conductive region 5 above the source region 21. Then a layer of 200 nm platinum/ruthenium (70/30 atom %) is provided over the surface of the semiconductor body 3. This layer is sputtered at a pressure of 0.65 mPa argon at room temperature (RF sputtering, 500 W power). Two sputtering sources are used here, which deposit alternately a ruthenium layer and a platinum layer of approximately 1 to 1.5 nm thickness. It is advantageous here when a platinum layer is provided as the final layer. The layers provided are then baked for 1 hour at 600° C. in an $N_2/O_2$ 80/20 atmosphere. A lower electrode 11 is created thereby with a structure according to the invention as shown in FIG. 3. A better surface of the lower electrode is obtained after baking in that the final layer provided was a platinum layer. It is found that an oxidic ferroelectric dielectric 12 provided on a lower electrode 11 having such a surface is highly resistant to defects in the dielectric 12 such as arise from known fatigue effects. The oxidic ferroelectric dielectric 12 is subsequently provided on the lower electrode 11. This ferroelectric dielectric is a known substance, in the present example lead-zirconium titanate (PZT), which is provided in known manner by a sol-gel technique. This starts with a solution of lead acetate, zirconium butoxide, and titanium n-butoxide in methoxyethanol in a composition of 1.1:0.35:0.65 (approximately 0.45 molar concentration). This solution is provided on the lower electrode in a centrifuge spinninig process (rotation speed 2500 rpm, 30 s). After the layer 12 has been provided, it is baked for 30 minutes at 550° C. in an oxygen atmosphere. The layer thickness of the ferroelectric material obtained in one spinning process and one baking cycle is approximately 0.1 µm. To obtain a desired layer thickness of approximately 0.2 µm, this process is carried out twice. Then the layer is baked for 1 hour at 600° C. A typical composition of the lead-zirconium titanate obtained by the above process is $Pb_{1.0}Zr_{0.35}Ti_{0.65}O_3$. Alternatively, a known technique such as sputtering or organometallic chemical vapour deposition (OMCVD) may be used. It is also possible to use lead titanate (PT), lead-lanthanum-zirconium titanate (PLZT), or some other known oxidic ferroelectric dielectric. A platinum upper electrode 13 is provided on the dielectric 12 through sputtering (see FIG. 5). The upper electrode 13, the dielectric 12, and the lower electrode 11 are patterned by photolithographical and etching techniques. The layer 111 comprising platinum is not etched away during this at the area of the tungsten plug 25 (see FIG. 1). The layer comprising platinum 111 then forms an electrical connection between the drain region 20 and further parts of the semiconductor device. The layer platinum is thus used as an additional wiring layer on the surface of the semiconductor body 3. The surface of the semiconductor body 3 is then covered with an insulating PE (plasma-enhanced) CVD silicon oxide layer 26. Contact holes are etched into this layer, wherein a titanium/tungsten barrier layer and an aluminium wiring layer 27 are provided in known manner. A semiconductor device thus manufactured has a very low resistance between the conducting region 5 and the lower electrode 11, i.e. in practice approximately $10^{-8}$ $\Omega/cm^2$.

Figure 6:
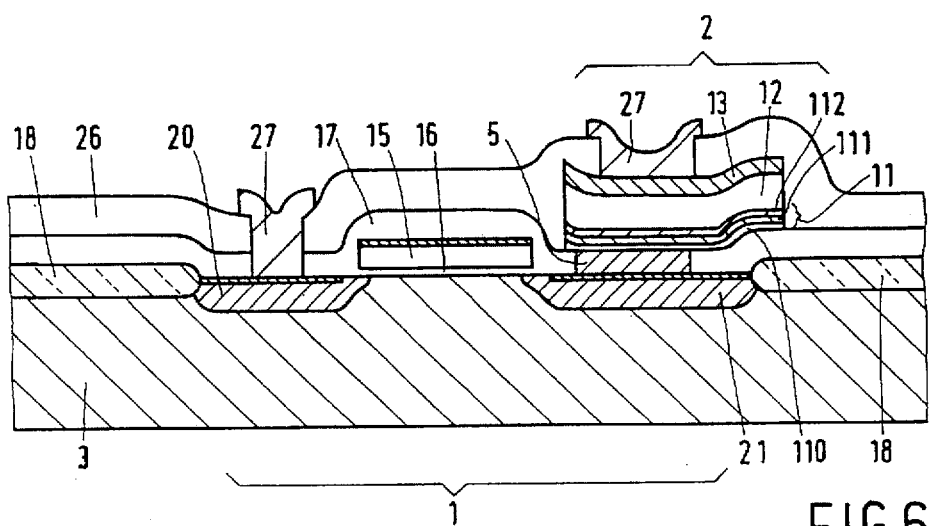
FIG. 6 is a cross-section of a further embodiment of a semiconductor device according to the invention.

FIG. 6 shows a second embodiment of a semiconductor device according to the invention. Here a layer 110 of the metal capable of forming a conductive oxide is present between the layer 111 comprising platinum and the conducting region 5. The permeability to oxygen of the layer 111 comprising platinum is strongly reduced also in this embodiment. Such a device is comparatively easy to manufacture. Starting with an MOS transistor covered with a phosphorous silicate glass layer 17 with a tungsten lead-through region 5 as in the previous embodiment (FIG. 4), a layer of 100 nm ruthenium with a layer of 100 nm platinum thereon is provided on the conducting region 5. Said layers are sputtered at a pressure of 0.65 mPa argon at room temperature (RF sputtering, 500 W power). Then the layers provided are baked for 1 hour at 600° C. in an $N_2/O_2$ 80/20 atmosphere. This leads to a lower electrode 11 which comprises in that order a ruthenium layer 110 with approximately 25 atom % platinum, a platinum layer 111 with approximately 15–20 atom % ruthenium, and the ruthenium oxide layer 112. It is suspected that both the ruthenium/platinum 75/25 layer and the platinum/ruthenium 85/15 layer play a part in blocking the oxygen diffusion. It is noted that AES analyses show that the surface of the lower electrode 11 is enriched with platinum. It is suspected that this enrichment leads to a good structure of the oxidic ferroelectric subsequently provided on this surface. In a known sputtering process, PZT is then provided on the lower electrode as the ferroelectric dielectric 12, and platinum as the upper electrode 13. The upper electrode 13, the dielectric 12, and the lower electrode 11 are then patterned in known manner by photolithographical techniques and etching. The semiconductor device is finished in known manner by the application of a PE CVD silicon oxide layer 26 and the provision of contacting means 27 for the upper electrode 13. This embodiment also has a very good electrical contact between the conducting region 5 and the lower electrode 11, i.e. $10^{-8}$ $\Omega/cm^2$.

The invention is not limited to the embodiments described above. Thus, for example, the embodiments 1 and 2 may be combined. In that case first a ruthenium layer is provided on the conducting surface 5, after which a platinum/ruthenium layer is provided through codeposition. Furthermore, the capacitor 2 is placed on a source region of an MOS transistor 1 in the embodiments. It will be obvious that alternative switching elements such as, for example, bipolar transistors may also be used. Furthermore, the conducting region 5 may comprise materials other than tungsten, for example doped silicon, silicide, silicon-germanium, or metals other than tungsten. Certain techniques for manufacturing the semiconductor device were mentioned above, but this implies by no means that the method according to the invention can only be implemented by such techniques. Thus, for example, sputtering for the provision of the electrodes 11, 13 may be replaced by alternative techniques such as chemical vapour deposition (CVD) or electrochemical deposition. The ferroelectric dielectric may be provided by sputtering instead of by a sol-gel technique. For more details on known techniques, the reader is referred to manuals such as S. M. Sze: "VLSI Technology", Mc-Graw-Hill Book Company, and S. Wolf: "Silicon Processing for the VLSI Era", vols. 1, 2, Lattice Press.

We claim:

1. A semiconductor device comprising:

a semiconductor body with a an electrically conducting region and a capacitor forming a memory element, said capacitor comprising a lower electrode, an oxidic ferroelectric dielectric, and an upper electrode, said lower electrode being in electrical contact with the conducting region and comprising a layer with a conductive metal oxide and a layer comprising platinum, the layer comprising platinum containing more than 15 atom % of a metal other than platinum capable of forming a conductive metal oxide, the layer comprising the conductive metal oxide being present between the layer comprising the platinum and the ferroelectric dielectric, and said lower electrode including two oxygen barriers, a first oxygen barrier comprising an alloy of said platinum and said metal other than platinum capable of forming said conductive metal oxide and a second oxygen barrier comprised by said first layer of a conductive metal oxide.

2. A semiconductor device as claimed in claim 1, characterized in that the metal capable of forming a conductive metal oxide comprises ruthenium.

3. A semiconductor device as claimed in claim 1, characterized in that a layer of the metal capable of forming a conductive oxide is present between the layer comprising platinum and the conducting region.

4. A semiconductor device as claimed in claim 1, characterized in that the conducting region comprises tungsten.

5. A semiconductor device as claimed in claim 1, characterized in that an electrical connection between or to further parts of the semiconductor device is formed from the layer comprising platinum.

6. A semiconductor device, comprising:

a semiconductor body;

a conductive region on the semiconductor body;

a ferroelectric layer comprising a ferroelectric material; and an electrode structure between the ferroelectric layer and the conductive region, said electrode structure comprising a first layer of a conductive metal oxide adjacent the ferroelectric layer and a second layer between the first layer and the conductive region, said second layer comprising a sublayer of platinum and a sublayer of a metal other than platinum capable of forming a conductive metal oxide, electrode structure including two oxygen barriers, a first oxygen barrier comprising an alloy of said platinum and said metal other than platinum capable of forming said conductive metal oxide and a second oxygen barrier comprised by said first layer of a conductive metal oxide.

7. A semiconductor device, comprising:

a semiconductor body;

a conductive region on the semiconductor body;

a ferroelectric layer comprising a ferroelectric material; and an electrode structure between the ferroelectric layer and the conductive region, said electrode structure comprising a first layer of a conductive metal oxide adjacent the ferroelectric layer and a second layer between the first layer and the conductive region, said second layer comprising platinum and at least 15 atm % of at least one of rhenium and ruthenium, said electrode structure including an oxygen barrier comprising an alloy of said platinum and said at least one of rhenium and ruthenium.

8. A semiconductor device according to claim 7, wherein said conductive region comprises tungsten.

9. A semiconductor device according to claim 7, wherein said second layer consists essentially of platinum and ruthenium.

* * * * *